(12) United States Patent
Guan

(10) Patent No.: US 10,672,354 B2
(45) Date of Patent: Jun. 2, 2020

(54) GOA CIRCUIT

(71) Applicant: Wuhan China Star Optoelectronics Technology Co., Ltd., Wuhan, Hubei (CN)

(72) Inventor: Yanqing Guan, Hubei (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 343 days.

(21) Appl. No.: 15/740,632

(22) PCT Filed: Nov. 29, 2017

(86) PCT No.: PCT/CN2017/113532
§ 371 (c)(1),
(2) Date: Dec. 28, 2017

(87) PCT Pub. No.: WO2019/100424
PCT Pub. Date: May 31, 2019

(65) Prior Publication Data
US 2019/0385555 A1  Dec. 19, 2019

(30) Foreign Application Priority Data

Nov. 22, 2017 (CN) .......................... 2017 1 1175909

(51) Int. Cl.
*G09G 3/36* (2006.01)

(52) U.S. Cl.
CPC ......... *G09G 3/3677* (2013.01); *G09G 3/3696* (2013.01); *G09G 2310/08* (2013.01); *G09G 2320/0257* (2013.01); *G09G 2330/027* (2013.01)

(58) Field of Classification Search
None
See application file for complete search history.

(56) References Cited

U.S. PATENT DOCUMENTS

| | | | | |
|---|---|---|---|---|
| 2015/0009113 | A1* | 1/2015 | Zeng | G09G 3/3677 345/100 |
| 2016/0189649 | A1* | 6/2016 | Xiao | G11C 19/28 345/214 |
| 2016/0358566 | A1* | 12/2016 | Li | G11C 19/28 |
| 2019/0073987 | A1* | 3/2019 | Lin | G09G 5/393 |

* cited by examiner

*Primary Examiner* — Parul H Gupta
(74) *Attorney, Agent, or Firm* — Hemisphere Law, PLLC; Zhigang Ma

(57) ABSTRACT

Disclosed is a GOA circuit, and the GOA circuit includes multiple stages of GOA unit circuits. Each stage of GOA unit circuit includes a first scan module, a first clock input module, a first signal port control module, a third signal port control module, a first output module, a first global signal operation module, a second scan module, a second clock input module, a second signal port control module, a fourth signal port control signal module, a second output module and a second global signal operation module. The afterimages that may occur when a power supply of a crystal display panel is abnormally cut off can be avoided by using the disclosed GOA circuit, and thus the user experience can be improved.

20 Claims, 3 Drawing Sheets

GOA CIRCUIT

RELATED APPLICATIONS

The present application is a National Phase of International Application Number PCT/CN2017/113532, filed on Nov. 29, 2017, and claims the priority of China Application No. 201711175909.0, filed on Nov. 22, 2017.

FIELD OF THE DISCLOSURE

The disclosure relates to a technology of the display field, and more particularly to a GOA circuit.

BACKGROUND

The crystal display panel has been widely used as the displayer in electronic devices. In a Gate Driver On Array (GOA) circuit, the gate driving circuit for the column scan is configured on an array substrate by using the process of the Thin Film Transistor (TFT) crystal displayer array. In this manner, TFTs of pixels of the crystal display panel can be driven on column by column, which can decrease the production cost and the border of the crystal display panel can be narrowed.

According to the type of TFTs used in the display panel, the display panel produced by using the Low Temperature Poly-Silicon (LTPS) technology includes the NMOS-type display panel, the PMOS-type display panel, and the CMOS-type display panel. Compared with the CMOS-type display panel, the phosphorus doping (i.e., the P doping) is not necessary for producing the NMOS-type display panel. Thus, the NMOS-type display panel has a lower cost and a better yield rate, which makes the NMOS-type display panel be much required in the market.

Currently, large size crystal display panel becomes the mainstream in the market. The load of the GOA circuit increases because the panel size is larger and more columns of pixels are driven. To bare the load, the TFTs size and the border of the panel both increase. As a result, the narrow border crystal display panel can be realized and the GOA circuit has more power loss.

In addition, when the power supply of the crystal display panel is abnormally cur off, if the "All Gate ON" cannot be realized in the GOA circuit ("All Gate ON" is to set all gate driving signals of the GOA circuit as "effective", and to do a scan for the crystal display panel simultaneously), there will be afterimages shown on crystal display panel.

SUMMARY

To solve the above mentioned problems, a GOA circuit is provided by the present disclosure, which can avoid the afterimages shown by a crystal display panel when its power supply is cut off and thus improves the user experience.

One GOA circuit provided by the present disclosure is used in a crystal display panel, and includes multiple stages of GOA unit circuits. Each stage of GOA unit circuit includes a first scan module, a first clock input module, a first signal port control module, a third signal port control module, a first output module, a first global signal operation module, a second scan module, a second clock input module, a second signal port control module, a fourth signal port control signal module, a second output module and a second global signal operation module. Except for the first stage of the GOA unit circuit and the last stage of the GOA unit circuit, the working mechanism of the $n^{th}$ stage of the GOA unit circuit ("n" is a positive integer) is described as follows. The first scan module and the second scan module are configured to control the GOA circuit to do a forward scan or a backward scan according to a first scan control signal or a second scan control signal. The first output module and the second output module are configured to both receive a first clock signal and sequentially output a $n^{th}$ scan signal and a $(n+2)^{th}$ scan signal according to the first clock signal. The first clock input module is configured to output a second clock signal or a fourth clock signal to the third signal port control module, and the second clock input module is configured to output the fourth clock signal or the second clock signal to the fourth signal port control signal module. The first signal port control module is configured to control the voltage level of a first signal port when the $n^{th}$ stage of the GOA unit circuit works, and the second signal port control module is configured to control the voltage level of a second signal port when the $n^{th}$ stage of the GOA unit circuit works. The third signal port control module is configured to control the voltage level of a third signal port when the $n^{th}$ stage of the GOA unit circuit works, and the fourth signal port control signal module is configured to control the voltage level of a fourth signal port when the $n^{th}$ stage of the GOA unit circuit works. The first global signal operation module and the second global signal operation module are configured to turn on all scan signals of the $n^{th}$ GOA unit circuit by using a first global signal when a power supply is cut off.

Except for the first stage of the GOA unit circuit and the last stage of the GOA unit circuit, in the $n^{th}$ stage of the GOA unit circuit, the first scan module includes a tenth TFT and a $14^{th}$ TFT, the gate of the tenth TFT is coupled to a $(n-2)^{th}$ scan signal outputted by the $(n-1)^{th}$ stage of the GOA unit circuit, the source of the tenth TFT is couple to the first scan control signal and the drain of the tenth TFT is couple to the first signal port, and the gate of the $14^{th}$ TFT is coupled to a $(n+2)^{th}$ scan signal outputted by the $n^{th}$ stage of the GOA unit circuit, the source of the $14^{th}$ TFT is couple to the second scan control signal, and the drain of the $14^{th}$ TFT is couple to the first signal port. In addition, the second scan module includes a $20^{th}$ TFT and a $24^{th}$ TFT, the gate of the $20^{th}$ TFT is coupled to a $n^{th}$ scan signal outputted by the $n^{th}$ stage of the GOA unit circuit, the source of the $20^{th}$ TFT is couple to the first scan control signal and the drain of the $20^{th}$ TFT is couple to the second signal port, and the gate of the $24^{th}$ TFT is coupled to a $(n+4)^{th}$ scan signal outputted by the $(n+1)^{th}$ stage of the GOA unit circuit, the source of the $24^{th}$ TFT is couple to the second scan control signal, and the drain of the $24^{th}$ TFT is couple to the second signal port.

The first scan module, the first clock input module, the first signal port control module and the first output module are electrically connected to the first signal port, the third signal port control module and the first global signal operation module are electrically connected to the third signal port, the second scan module, the second clock input module, the second signal port control module and the second output module are electrically connected to the second signal port, and the fourth signal port control signal module and the second global signal operation module are electrically connected to the fourth signal port.

In the first stage of the GOA unit circuit, the gate of the tenth TFT is coupled to a startup signal, and the first stage of the GOA unit circuit includes a $19^{th}$ TFT. The gate of the $19^{th}$ TFT is coupled to a first scan signal outputted by the first stage of the GOA unit circuit, the source of the $19^{th}$ is coupled to a constant low voltage, and the drain of the $19^{th}$ TFT is coupled to the gate of the tenth TFT.

In the last stage of the GOA unit circuit, the gate of the 24$^{th}$ TFT is coupled to the startup signal, and the last stage of the GOA unit circuit includes a 29$^{th}$ TFT. The gate of the 29$^{th}$ TFT is coupled to a last scan signal outputted by the last stage of the GOA unit circuit, the source of the 29$^{th}$ is coupled to a constant low voltage and the drain of the 29$^{th}$ TFT is coupled to the gate of the 24$^{th}$ TFT.

The first output module includes a 30$^{th}$ TFT, a 31$^{st}$; TFT and a 32$^{th}$ TFT. The source of the 30$^{th}$ TFT is coupled to the first signal port, and the gate of the 30$^{th}$ TFT is coupled to a constant high voltage. The gate of the 31$^{th}$ TFT is coupled to the drain of the 30$^{th}$ TFT, and the drain of the 31$^{th}$ TFT is coupled to the first clock signal. The gate of the 32$^{th}$ TFT is coupled to the third signal port, the source of the 32$^{th}$ TFT is coupled to a constant low voltage, and the drain of the 32$^{th}$ TFT is coupled to the source of the 31$^{th}$ TFT and is electrically connected to the n$^{th}$ scan signal outputted by the n$^{th}$ stage of the GOA unit circuit. The second output module includes a 40$^{th}$ TFT, a 41$^{th}$ TFT and a 42$^{th}$ TFT. The source of the 40$^{th}$ TFT is coupled to the second signal port, and the gate of the 40$^{th}$ TFT is coupled to a constant high voltage. The gate of the 41$^{th}$ TFT is coupled to the drain of the 40$^{th}$ TFT, and the drain of the 41$^{th}$ TFT is coupled to the first clock signal. The gate of the 42$^{th}$ TFT is coupled to the fourth signal port, the source of the 42$^{th}$ TFT is coupled to a constant low voltage, and the drain of the 42$^{th}$ TFT is coupled to the source of the 41$^{th}$ TFT and is electrically connected to the (n+2)$^{th}$ scan signal outputted by the n$^{th}$ stage of the GOA unit circuit.

The first clock input module includes a 11$^{th}$ TFT and a 12$^{th}$ TFT. The gate of the 11$^{th}$ TFT is coupled to the first scan control signal, and the drain of the 11$^{th}$ TFT is coupled to the second clock signal. The gate of the 12$^{th}$ TFT is coupled to the second scan control signal, the source of the 12$^{th}$ TFT is coupled to the fourth clock signal, and the drain of the 12$^{th}$ TFT is coupled to the source of the 11$^{th}$ TFT. The second clock input module includes a 21$^{th}$ TFT and a 22$^{th}$ TFT. The gate of the 21$^{th}$ TFT is coupled to the first scan control signal, and the drain of the 21$^{th}$ TFT is coupled to the fourth clock signal. The gate of the 22$^{th}$ TFT is coupled to the second scan control signal, the source of the 22$^{th}$ TFT is coupled to the second clock signal, and the drain of the 22$^{th}$ TFT is coupled to the source of the 21$^{th}$ TFT.

The first signal port control module includes a 16$^{th}$ TFT and a tenth capacitor. The gate of the 16$^{th}$ TFT is coupled to the third signal port, the drain of the 16$^{th}$ TFT is coupled to the first signal port, and the source of the 16$^{th}$ TFT is coupled to a constant low voltage. One end of the tenth capacitor is coupled to the constant low voltage, and the other end of the tenth capacitor is coupled to the first signal port. The second signal port control module includes a 26$^{th}$ TFT and a 20$^{th}$ capacitor. The gate of the 26$^{th}$ TFT is coupled to the fourth signal port, the drain of the 26$^{th}$ TFT is coupled to the second signal port, and the source of the 26$^{th}$ TFT is coupled to a constant low voltage. One end of the 20$^{th}$ capacitor is coupled to the constant low voltage, and the other end of the 20$^{th}$ capacitor is coupled to the second signal port.

The third signal port control module includes a 13$^{th}$ TFT, a 15$^{th}$ TFT and a 11$^{th}$ capacitor. The gate of the 13$^{th}$ TFT is coupled to the source of the 11$^{th}$ TFT, the drain of the 13$^{th}$ TFT is coupled to a constant high voltage, and the source of the 13$^{th}$ TFT is coupled to the third signal port. The gate of the 15$^{th}$ TFT is coupled to the first signal port, the drain of the 15$^{th}$ TFT is coupled to a constant low voltage, and the source of the 15$^{th}$ TFT is coupled to the third signal port. One end of the 11$^{th}$ capacitor is coupled to the constant low voltage, and the other end of the 11$^{th}$ capacitor is coupled to the third signal port. The fourth signal port control module includes a 23$^{th}$ TFT, a 25$^{th}$ TFT and a 21$^{th}$ capacitor. The gate of the 23$^{th}$ TFT is coupled to the source of the 21$^{th}$ TFT, the drain of the 23$^{th}$ TFT is coupled to a constant high voltage, and the source of the 23$^{th}$ TFT is coupled to the fourth signal port. The gate of the 25$^{th}$ TFT is coupled to the second signal port, the drain of the 25$^{th}$ TFT is coupled to a constant low voltage, and the source of the 25$^{th}$ TFT is coupled to the fourth signal port. One end of the 21$^{th}$ capacitor is coupled to the constant low voltage, and the other end of the 21$^{th}$ capacitor is coupled to the fourth signal port.

The first global signal operation module includes a 17$^{th}$ TFT and a 18$^{Th}$ TFT. The gate and the source of the 17$^{th}$ TFT are coupled, and the drain of the 17$^{th}$ TFT is coupled to the n$^{th}$ scan signal outputted by the n$^{th}$ stage of the GOA unit circuit. The gate of the 18$^{th}$ TFT is coupled to the gate of the 17$^{th}$ TFT and is coupled to the first global signal, the drain of the 18$^{th}$ TFT is coupled to the third signal port, and the source of the 18$^{th}$ TFT is coupled to a constant low voltage. The second global signal operation module includes a 27$^{th}$ TFT and a 28$^{Th}$ TFT. The gate and the source of the 27$^{th}$ TFT are coupled, and the drain of the 27$^{th}$ TFT is coupled to the (n+2)$^{th}$ scan signal outputted by the n$^{th}$ stage of the GOA unit circuit. The gate of the 28$^{th}$ TFT is coupled to the gate of the 27$^{th}$ TFT and is coupled to the first global signal, the drain of the 28$^{th}$ TFT is coupled to the fourth signal port, and the source of the 28$^{th}$ TFT is coupled to a constant low voltage.

All TFTs are N-channel TFTs.

Another GOA circuit provided by the present disclosure is used in a crystal display panel, and includes multiple stages of GOA unit circuits. Each stage of GOA unit circuit includes a first scan module, a first clock input module, a first signal port control module, a third signal port control module, a first output module, a first global signal operation module, a second scan module, a second clock input module, a second signal port control module, a fourth signal port control signal module, a second output module and a second global signal operation module. Except for the first stage of the GOA unit circuit and the last stage of the GOA unit circuit, the working mechanism of the n$^{th}$ stage of the GOA unit circuit ("n" is a positive integer) is described as follows. The first scan module and the second scan module are configured to control the GOA circuit to do a forward scan or a backward scan according to a first scan control signal or a second scan control signal. The first output module and the second output module are configured to both receive a first clock signal and sequentially output a n$^{th}$ scan signal and a (n+2)$^{th}$ scan signal according to the first clock signal. The first dock input module is configured to output a second dock signal or a fourth clock signal to the third signal port control module, and the second dock input module is configured to output the fourth dock signal or the second dock signal to the fourth signal port control signal. The first signal port control module is configured to control the voltage level of a first signal port when the n$^{th}$ stage of the GOA unit circuit works, and the second signal port control module is configured to control the voltage level of a second signal port when the n$^{th}$ stage of the GOA unit circuit works. The third signal port control module is configured to control the voltage level of a third signal port when the n$^{th}$ stage of the GOA unit circuit works, and the fourth signal port control signal is configured to control the voltage level of a fourth signal port when the n$^{th}$ stage of the GOA unit circuit works. The first global signal operation module and the second global signal operation module are configured to turn on all scan signals of the n$^{th}$ GOA unit circuit by using a first global signal when a power supply is cut off. The first global signal operation module includes a 17$^{th}$ TFT and a 18$^{Th}$ TFT. The gate and the source of the 17$^{th}$ TFT are coupled, and the drain of the 17$^{th}$ TFT is coupled to the n$^{th}$ scan signal outputted by the n$^{th}$ stage of the GOA unit circuit. The gate of the 18$^{th}$ TFT is coupled to the gate of the 17$^{th}$ TFT and is coupled to the first global signal, the drain of the 18$^{th}$ TFT is coupled to the third signal port, and the source of the 18$^{th}$ TFT is coupled to a constant low voltage. The second global signal operation module includes a 27$^{th}$ TFT and a 28$^{Th}$ TFT. The gate and the source of the 27$^{th}$ TFT are coupled, and the drain of the 27$^{th}$ TFT is coupled to the (n+2)$^{th}$ scan signal outputted by the n$^{th}$ stage of the GOA unit circuit. The gate of the 28$^{th}$ TFT is coupled to the gate of the 27$^{th}$ TFT and is coupled to the first global signal, the drain of the 28$^{th}$ TFT is coupled to the fourth signal port, and the source of the 28$^{th}$ TFT is coupled to a constant low voltage.

The first scan module, the first clock input module, the first signal port control module and the first output module are electrically connected to the first signal port. The third signal port control module and the first global signal operation module are electrically connected to the third signal port. The second scan module, the second clock input module, the second signal port control module and the second output module are electrically connected to the second signal port. The fourth signal port control signal module and the second global signal operation module are electrically connected to the fourth signal port.

Except for the first stage of the GOA unit circuit and the last stage of the GOA unit circuit, in the n$^{th}$ stage of the GOA unit circuit, the first scan module includes a tenth TFT and a 14$^{th}$ TFT, the gate of the tenth TFT is coupled to a (n−2)$^{th}$ scan signal outputted by the (n−1)$^{th}$ stage of the GOA unit circuit, the source of the tenth TFT is couple to the first scan control signal and the drain of the tenth TFT is couple to the first signal port, and the gate of the 14$^{th}$ TFT is coupled to a (n+2)$^{th}$ scan signal outputted by the n$^{th}$ stage of the GOA unit circuit, the source of the 14$^{th}$ TFT is couple to the second scan control signal and the drain of the 14$^{th}$ TFT is couple to the first signal port. In addition, the second scan module includes a 20$^{th}$ TFT and a 24$^{th}$ TFT, the gate of the 20$^{th}$ TFT is coupled to a n$^{th}$ scan signal outputted by the n$^{th}$ stage of the GOA unit circuit, the source of the 20$^{th}$ TFT is couple to the first scan control signal and the drain of the 20$^{th}$ TFT is couple to the second signal port, and the gate of the 24$^{th}$ TFT is coupled to a (n+4)$^{th}$ scan signal outputted by the (n+1)$^{th}$ stage of the GOA unit circuit, the source of the 24$^{th}$ TFT is couple to the second scan control signal and the drain of the 24$^{th}$ TFT is couple to the second signal port.

In the first stage of the GOA unit circuit, the gate of the tenth TFT is coupled to a startup signal. The first stage of the GOA unit circuit includes a 19$^{th}$ TFT. The gate of the 19$^{th}$ TFT is coupled to a first scan signal outputted by the first stage of the GOA unit circuit, the source of the 19$^{th}$ is coupled to a constant low voltage, and the drain of the 19$^{th}$ TFT is coupled to the gate of the tenth TFT.

In the last stage of the GOA unit circuit, the gate of the 24$^{th}$ TFT is coupled to the startup signal. The last stage of the GOA unit circuit includes a 29$^{th}$ TFT. The gate of the 29$^{th}$ TFT is coupled to a last scan signal outputted by the last stage of the GOA unit circuit, the source of the 29$^{th}$ is coupled to a constant low voltage, and the drain of the 29$^{th}$ TFT is coupled to the gate of the 24$^{th}$ TFT.

The first output module includes a 30$^{th}$ TFT, a 31$^{th}$ TFT and a 32$^{th}$ TFT. The source of the 30$^{th}$ TFT is coupled to the first signal port, and the gate of the 30$^{th}$ TFT is coupled to a constant high voltage. The gate of the 31$^{th}$ TFT is coupled to the drain of the 30$^{th}$ TFT, and the drain of the 31$^{th}$ TFT is coupled to the first clock signal. The gate of the 32$^{th}$ TFT is coupled to the third signal port, the source of the 32$^{th}$ TFT is coupled to a constant low voltage, and the drain of the 32$^{th}$ TFT is coupled to the source of the 31$^{th}$ TFT and is electrically connected to the n$^{th}$ scan signal outputted by the n$^{th}$ stage of the GOA unit circuit. The second output module includes a 40$^{th}$ TFT, a 41$^{th}$ TFT and a 42$^{th}$ TFT. The source of the 40$^{th}$ TFT is coupled to the second signal port, and the gate of the 40$^{th}$ TFT is coupled to a constant high voltage. The gate of the 41$^{th}$ TFT is coupled to the drain of the 40$^{th}$ TFT, and the drain of the 41$^{th}$ TFT is coupled to the first clock signal. The gate of the 42$^{th}$ TFT is coupled to the fourth signal port, the source of the 42$^{th}$ TFT is coupled to a constant low voltage, and the drain of the 42$^{th}$ TFT is coupled to the source of the 41$^{th}$ TFT and is electrically connected to the (n+2)$^{th}$ scan signal outputted by the n$^{th}$ stage of the GOA unit circuit.

The first clock input module includes a 11$^{th}$ TFT and a 12$^{th}$ TFT. The gate of the 11$^{th}$ TFT is coupled to the first scan control signal, and the drain of the 11$^{th}$ TFT is coupled to the second clock signal. The gate of the 12$^{th}$ TFT is coupled to the second scan control signal, the source of the 12$^{th}$ TFT is coupled to the fourth clock signal, and the drain of the 12$^{th}$ TFT is coupled to the source of the 11$^{th}$ TFT. The second clock input module includes a 21$^{th}$ TFT and a 22$^{th}$ TFT. The gate of the 21$^{th}$ TFT is coupled to the first scan control signal, and the drain of the 21$^{th}$ TFT is coupled to the fourth clock signal. The gate of the 22$^{th}$ TFT is coupled to the second scan control signal, the source of the 22$^{th}$ TFT is coupled to the second clock signal, and the drain of the 22$^{th}$ TFT is coupled to the source of the 21$^{th}$ TFT.

The first signal port control module includes a 16$^{th}$ TFT and a tenth capacitor. The gate of the 16$^{th}$ TFT is coupled to the third signal port, the drain of the 16$^{th}$ TFT is coupled to the first signal port, and the source of the 16$^{th}$ TFT is coupled to a constant low voltage. One end of the tenth capacitor is coupled to the constant low voltage, and the other end of the tenth capacitor is coupled to the first signal port. The second signal port control module includes a 26$^{th}$ TFT and a 20$^{th}$ capacitor. The gate of the 26$^{th}$ TFT is coupled to the fourth signal port, the drain of the 26$^{th}$ TFT is coupled to the second signal port, and the source of the 26$^{th}$ TFT is coupled to a constant low voltage. One end of the 20$^{th}$ capacitor is coupled to the constant low voltage, and the other end of the 20$^{th}$ capacitor is coupled to the second signal port.

The third signal port control module includes a 13$^{th}$ TFT, a 15$^{th}$ TFT and a 11$^{th}$ capacitor. The gate of the 13$^{th}$ TFT is coupled to the source of the 11$^{th}$ TFT, the drain of the 13$^{th}$ TFT is coupled to a constant high voltage, and the source of the 13$^{th}$ TFT is coupled to the third signal port. The gate of the 15$^{th}$ TFT is coupled to the first signal port, the drain of the 15$^{th}$ TFT is coupled to a constant low voltage, and the source of the 15$^{th}$ TFT is coupled to the third signal port. One end of the 11$^{th}$ capacitor is coupled to the constant low voltage, and the other end of the 11$^{th}$ capacitor is coupled to the third signal port. The fourth signal port control module includes a 23$^{th}$ TFT, a 25$^{th}$ TFT and a 21$^{th}$ capacitor. The gate of the 23$^{th}$ TFT is coupled to the source of the 21$^{th}$ TFT, the drain of the 23$^{th}$ TFT is coupled to a constant high voltage, and the source of the 23$^{th}$ TFT is coupled to the fourth signal port. The gate of the 25$^{th}$ TFT is coupled to the second signal port, the drain of the 25$^{th}$ TFT is coupled to a constant low voltage, and the source of the 25$^{th}$ TFT is coupled to the fourth signal port. One end of the 21$^{th}$ capacitor is coupled to the constant low voltage, and the other end of the 21$^{th}$ capacitor is coupled to the fourth signal port.

The present disclosure has advantages as below.

In the present disclosure, the first global signal operation module and the second global signal operation module are configured in each stage of the GOA unit circuit, so "All Gate ON" can be realized when the power supply of the crystal display panel is cut off. Since all pixels of the crystal display panel can be turned on when the power supply of the crystal display panel is cut off, charges of the pixel electrodes can be discharged in time. The charges can be discharged through the data lines of the crystal display panel, so that the afterimages that may occur when the power supply of the crystal display panel is cut off can be avoided. The afterimages of the first column and the last column can be also avoided. As a result, the user experience can be improved.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

Also, only essential structures and/or steps are shown in figures and details not much relevant are omitted for clearly illustrating the present disclosure.

Figure 1:
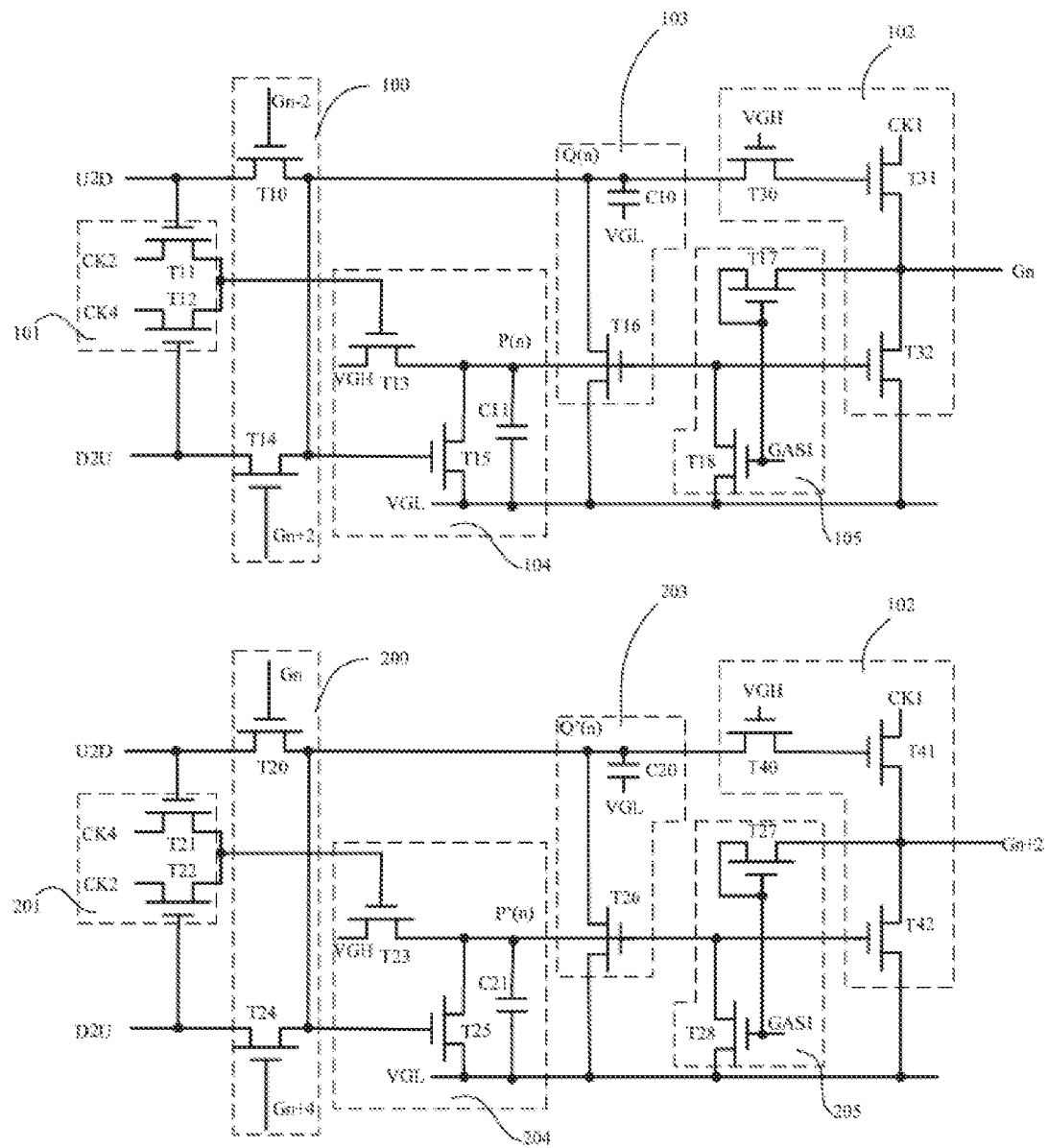
FIG. 1 is a circuit diagram of the n$^{th}$ stage of the GOA unit circuit of a GOA circuit according to one embodiment of the disclosure.

Referring to FIG. 1, a circuit diagram of the n$^{th}$ stage of the GOA unit circuit of a GOA circuit according to one embodiment of the disclosure is shown. As shown in FIG. 1, the GOA circuit in this embodiment is used in a crystal display panel, and includes multiple stages of GOA unit circuits. Each stage of GOA unit circuit includes a first scan module 100, a first clock input module 101, a first signal port control module 103, a third signal port control module 104, a first output module 102, a first global signal operation module 105, a second scan module 200, a second clock input module 201, a second signal port control module 203, a fourth signal port control signal module 204, a second output module 202 and a second global signal operation module 205.

The first scan module 100, the first clock input module 101, the first signal port control module 103 and the first output module 102 are electrically connected to the first signal port Q(n), the third signal port control module 104 and the first global signal operation module 105 are electrically connected to the third signal port P(n), the second scan module 200, the second clock input module 201, the second signal port control module 203 and the second output module 202 are electrically connected to the second signal port Q'(n), and the fourth signal port control signal module 204 and the second global signal operation module 205 are electrically connected to the fourth signal port P'(n).

Except for the first stage of the GOA unit circuit and the last stage of the GOA unit circuit, the working mechanism of the n$^{th}$ stage of the GOA unit circuit ("n" is a positive integer) is described as follows.

The first scan module 100 and the second scan module 200 are configured to control the GOA circuit to do a forward scan or a backward scan according to a first scan control signal or a second scan control signal. The phase of the first scan control signal is opposite to the phase of the second scan control signal. It should be noted that, in this embodiment, TFTs of pixels of the crystal display panel can be turned on column by column through the forward scan (i.e., the first scan control signal U2D is at high level, and the second scan control signal D2U is at low level) or through the backward scan (i.e., the first scan control signal U2D is at low level, and the second scan control signal D2U is at high level).

The first output module 102 and the second output module 202 are configured to both receive a first clock signal CK1 and sequentially output a n$^{th}$ scan signal Gn and a (n+2)$^{th}$ scan signal Gn+2 according to the first clock signal CK1.

The first clock input module 101 is configured to output a second clock signal CK2 or a fourth clock signal CK4 to the third signal port control module 104, and the second clock input module 201 is configured to output the fourth clock signal CK4 or the second clock signal CK2 to the fourth signal port control signal module 204.

The first signal port control module 103 is configured to control the voltage level of a first signal port Q(n) when the n$^{th}$ stage of the GOA unit circuit works, and the second signal port control module 203 is configured to control the voltage level of a second signal port Q'(n) when the n$^{th}$ stage of the GOA unit circuit works.

The third signal port control module 104 is configured to control the voltage level of a third signal port P(n) when the n$^{th}$ stage of the GOA unit circuit works. Specifically, the voltage of the third signal port P(n) is dropped according to the second clock signal CK2 or the fourth clock signal CK4. The fourth signal port control signal module 204 is configured to control the voltage level of a fourth signal port P'(n) when the n$^{th}$ stage of the GOA unit circuit works.

The first global signal operation module 105 and the second global signal operation module 205 are configured to turn on all scan signals of the n$^{th}$ GOA unit circuit by using a first global signal GAS1 when a power supply is cut off.

Except for the first stage of the GOA unit circuit and the last stage of the GOA unit circuit, in the n$^{th}$ stage of the GOA unit circuit, the first scan module 100 includes a tenth TFT T10 and a 14$^{th}$ TFT T14. The gate of the tenth TFT T10 is coupled to a (n−2)$^{th}$ scan signal Gn−2 outputted by the (n−1)$^{th}$ stage of the GOA unit circuit, the source of the tenth TFT T10 is couple to the first scan control signal and the drain of the tenth TFT T10 is couple to the first signal port Q(n). The gate of the 14$^{th}$ TFT T14 is coupled to a (n+2)$^{th}$ scan signal Gn+2 outputted by the n$^{th}$ stage of the GOA unit circuit, the source of the 14$^{th}$ TFT T14 is couple to the second scan control signal, and the drain of the 14$^{th}$ TFT is couple to the first signal port Q(n).

In addition, the second scan module 200 includes a 20$^{th}$ TFT T20 and a 24$^{th}$ TFT T24. The gate of the 20$^{th}$ TFT T20 is coupled to a n$^{th}$ scan signal Gn outputted by the n$^{th}$ stage of the GOA unit circuit, the source of the 20$^{th}$ TFT T20 is couple to the first scan control signal and the drain of the 20$^{th}$ TFT T20 is couple to the second signal port Q'(n). The gate of the 24$^{th}$ TFT T24 is coupled to a (n+4)$^{th}$ scan signal Gn+4 outputted by the (n+1)$^{th}$ stage of the GOA unit circuit, the source of the 24$^{th}$ TFT T24 is couple to the second scan control signal, and the drain of the 24$^{th}$ TFT T24 is couple to the second signal port Q'(n).

The first output module 102 includes a 30$^{th}$ TFT T30, a 31$^{th}$ TFT T31 and a 32$^{th}$ TFT T32. The source of the 30$^{th}$ TFT T30 is coupled to the first signal port Q(n), and the gate of the 30$^{th}$ TFT T30 is coupled to a constant high voltage. The gate of the 31$^{th}$ TFT T31 is coupled to the drain of the 30$^{th}$ TFT T30, and the drain of the 31$^{th}$ TFT T31 is coupled to the first clock signal CK1. The gate of the 32$^{th}$ TFT T32 is coupled to the third signal port P(n), the source of the 32$^{th}$ TFT T32 is coupled to a constant low voltage, and the drain of the 32$^{th}$ TFT T32 is coupled to the source of the 31$^{th}$ TFT T31 and is electrically connected to the n$^{th}$ scan signal Gn outputted by the n$^{th}$ stage of the GOA unit circuit.

The second output module 202 includes a 40$^{th}$ TFT T40, a 41$^{th}$ TFT T41 and a 42$^{th}$ TFT T42. The source of the 40$^{th}$ TFT T40 is coupled to the second signal port Q'(t), and the gate of the 40$^{th}$ TFT T40 is coupled to a constant high voltage. The gate of the 41$^{th}$ TFT T41 is coupled to the drain of the 40$^{th}$ TFT T40, and the drain of the 41$^{th}$ TFT T41 is coupled to the first clock signal CK1. The gate of the 42$^{th}$ TFT T42 is coupled to the fourth signal port P'(n), the source of the 42$^{th}$ TFT T42 is coupled to a constant low voltage, and the drain of the 42$^{th}$ TFT T42 is coupled to the source of the 41$^{th}$ TFT T41 and is electrically connected to the (n+2)$^{th}$ scan signal Gn+2 outputted by the n$^{th}$ stage of the GOA unit circuit.

The first clock input module 101 includes a 11$^{th}$ TFT T11 and a 12$^{th}$ TFT T12. The gate of the 11$^{th}$ TFT T11 is coupled to the first scan control signal, and the drain of the 11$^{th}$ TFT T11 is coupled to the second clock signal CK2. The gate of the 12$^{th}$ TFT T12 is coupled to the second scan control signal, the source of the 12$^{th}$ TFT T12 is coupled to the fourth clock signal CK4, and the drain of the 12$^{th}$ TFT T12 is coupled to the source of the 11$^{th}$ TFT T11.

The second clock input module 201 includes a 21$^{th}$ TFT T21 and a 22$^{th}$ TFT T22. The gate of the 21$^{th}$ TFT T21 is coupled to the first scan control signal, and the drain of the 21$^{th}$ TFT T21 is coupled to the fourth clock signal CK4. The gate of the 22$^{th}$ TFT T22 is coupled to the second scan control signal, the source of the 22$^{th}$ TFT T22 is coupled to the second clock signal CK2, and the drain of the 22$^{th}$ TFT T22 is coupled to the source of the 21$^{th}$ TFT T21.

The first signal port control module 103 includes a 16$^{th}$ TFT T16 and a tenth capacitor C10. The gate of the 16$^{th}$ TFT T16 is coupled to the third signal port P(n), the drain of the 16$^{th}$ TFT T16 is coupled to the first signal port Q(n), and the source of the 16$^{th}$ TFT T16 is coupled to a constant low voltage. One end of the tenth capacitor C10 is coupled to the constant low voltage, and the other end of the tenth capacitor C10 is coupled to the first signal port Q(n).

The second signal port control module 203 includes a 26$^{th}$ TFT T26 and a 20$^{th}$ capacitor C20. The gate of the 26$^{th}$ TFT T26 is coupled to the fourth signal port P'(n), the drain of the 26$^{th}$ TFT T26 is coupled to the second signal port Q'(n), and the source of the 26$^{th}$ TFT T26 is coupled to a constant low voltage. One end of the 20$^{th}$ capacitor C20 is coupled to the constant low voltage, and the other end of the 20$^{th}$ capacitor C20 is coupled to the second signal port Q'(n).

The third signal port control module 104 includes a 13$^{th}$ TFT T13, a 15$^{th}$ TFT T15 and a 11$^{th}$ capacitor C11. The gate of the 13$^{th}$ TFT T13 is coupled to the source of the 11$^{th}$ TFT T11, the drain of the 13$^{th}$ TFT T13 is coupled to a constant high voltage, and the source of the 13$^{th}$ TFT T13 is coupled to the third signal port P(n). The gate of the 15$^{th}$ TFT T15 is coupled to the first signal port Q(n), the drain of the 15$^{th}$ TFT T15 is coupled to a constant low voltage, and the source of the 15$^{th}$ TFT T15 is coupled to the third signal port P(n). One end of the 11$^{th}$ capacitor C11 is coupled to the constant low voltage, and the other end of the 11$^{th}$ capacitor C11 is coupled to the third signal port P(n). It can be understood that, the turning on and the turning off of the 13$^{th}$ TFT T13 is controlled according to the clock signal outputted by the first clock input module 101.

The fourth signal port control module 204 includes a 23$^{th}$ TFT T23, a 25$^{th}$ TFT T25 and a 21$^{th}$ capacitor C21. The gate of the 23$^{th}$ TFT T23 is coupled to the source of the 21$^{th}$ TFT T21, the drain of the 23$^{th}$ TFT T23 is coupled to a constant high voltage, and the source of the 23$^{th}$ TFT T23 is coupled to the fourth signal port P'(n). The gate of the 25$^{th}$ TFT T25 is coupled to the second signal port Q'(n), the drain of the 25$^{th}$ TFT T25 is coupled to a constant low voltage, and the source of the 25$^{th}$ TFT T25 is coupled to the fourth signal port P'(n). One end of the 21$^{th}$ capacitor C21 is coupled to the constant low voltage, and the other end of the 21$^{th}$ capacitor C21 is coupled to the fourth signal port P'(n). It can be understood that, the turning on and the turning off of the 23$^{th}$ TFT T23 is controlled according to the clock signal outputted by the second clock input module 201.

The first global signal operation module 105 includes a 17$^{th}$ TFT T17 and a 18$^{Th}$ TFT T18. The gate and the source of the 17$^{th}$ TFT T17 are coupled, and the drain of the 17$^{th}$ TFT T17 is coupled to the n$^{th}$ scan signal Gn outputted by the n$^{th}$ stage of the GOA unit circuit. The gate of the 18$^{th}$ TFT T18 is coupled to the gate of the 17$^{th}$ TFT T17 and is coupled to the first global signal GAS1, the drain of the 18$^{th}$ TFT T18 is coupled to the third signal port P(n), and the source of the 18$^{th}$ TFT T18 is coupled to a constant low voltage.

The second global signal operation module 205 includes a 27$^{th}$ TFT T27 and a 28$^{th}$ TFT T28. The gate and the source of the 27$^{th}$ TFT T27 are coupled, and the drain of the 27$^{th}$ TFT T17 is coupled to the (n+2)$^{th}$ scan signal Gn+2 outputted by the n$^{th}$ stage of the GOA unit circuit. The gate of the 28$^{th}$ TFT T28 is coupled to the gate of the 27$^{th}$ TFT T27 and is coupled to the first global signal GAS1, the drain of the 28$^{th}$ TFT T28 is coupled to the fourth signal port P'(n), and the source of the 28$^{th}$ TFT T28 is coupled to a constant low voltage.

It should be noted that, in one embodiment, all TFTs are N-channel TFTs, and the drain and the source of each TFT can be exchanged.

Figure 2:
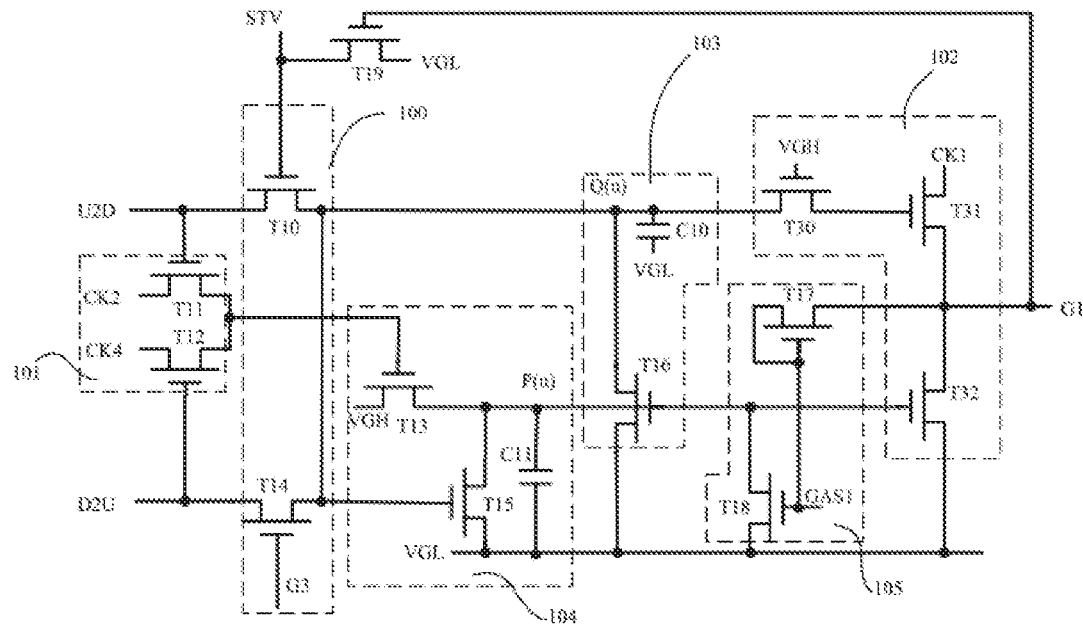
FIG. 2 is a circuit diagram of part of the first stage of the GOA unit circuit of a GOA circuit according to one embodiment of the disclosure.

Referring to FIG. 2, a circuit diagram of part of the first stage of the GOA unit circuit of a GOA circuit according to one embodiment of the disclosure is shown. FIG. 2 only shows part of the first stage of the GOA unit circuit of a GOA circuit, and the other part of the first stage of the GOA unit circuit of the GOA circuit can be referred to FIG. 1. The differences between the first stage of the GOA unit circuit shown in FIG. 2 and the $n^{th}$ stage of the GOA unit circuit shown in FIG. 1 are described as follows.

In the first stage of the GOA unit circuit, the gate of the tenth TFT T10 is coupled to a startup signal STV. In addition, the first stage of the GOA unit circuit, further includes a $19^{th}$ TFT T19. The gate of the $19^{th}$ TFT T19 is coupled to a first scan signal G1 outputted by the first stage of the GOA unit circuit, the source of the $19^{th}$ T19 is coupled to a constant low voltage, and the drain of the $19^{th}$ TFT T19 is coupled to the gate of the tenth TFT T10. When the power supply of the crystal display panel is cut off, the first scan signal G1 is at high level, such that the $19^{th}$ TFT T19 is turned on, and the voltage level of the startup signal STV is dropped. Therefore, the working condition of the first stage of the GOA unit circuit is similar to the working conditions of the other stages of the GOA unit circuit, and thus the afterimage of the first column that may occur when the voltage level of the startup signal STV is too high can be avoided.

Figure 3:
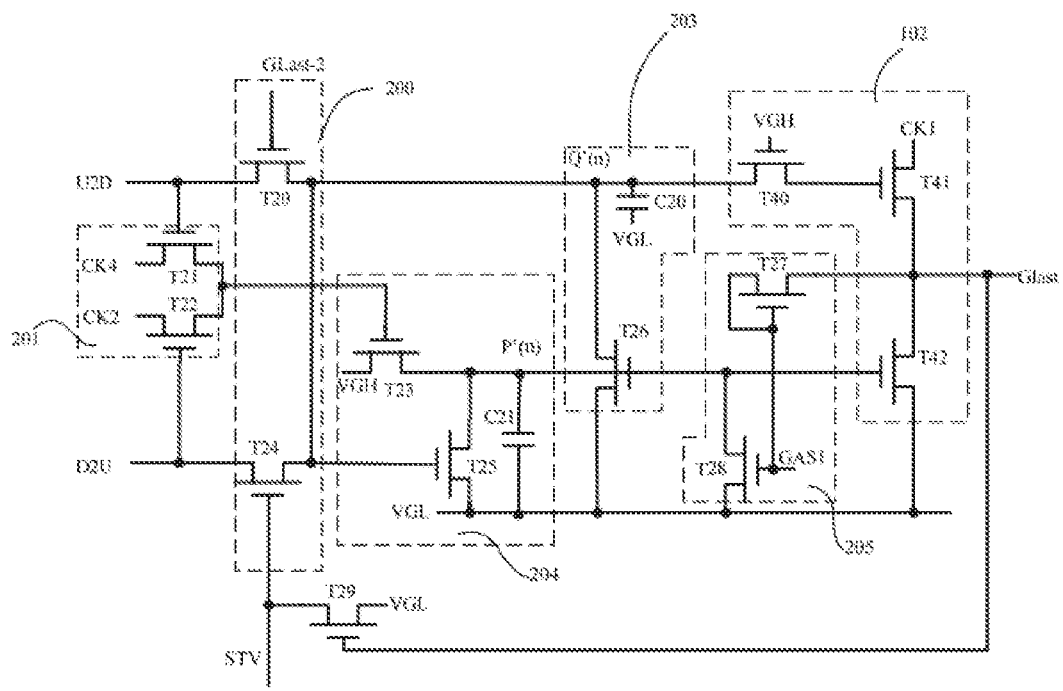
FIG. 3 is a circuit diagram of part of the last stage of the GOA unit circuit of a GOA circuit according to one embodiment of the disclosure.

Referring to FIG. 3, a circuit diagram of part of the last stage of the GOA unit circuit of a GOA circuit according to one embodiment of the disclosure is shown. FIG. 3 only shows part of the last stage of the GOA unit circuit of a GOA circuit, and the other part of the last stage of the GOA unit circuit of the GOA circuit can be referred to FIG. 1. The differences between the last stage of the GOA unit circuit shown in FIG. 3 and the $n^{th}$ stage of the GOA unit circuit shown in FIG. 1 are described as follows.

In the last stage of the GOA unit circuit, the gate of the $24^{th}$ TFT is coupled to a startup signal STV. In addition, the last stage of the GOA unit circuit includes a $29^{th}$ TFT T29. The gate of the $29^{th}$ TFT T29 is coupled to a last scan signal Glast outputted by the last stage of the GOA unit circuit, the source of the $29^{th}$ T29 is coupled to a constant low voltage and the drain of the $29^{th}$ TFT T29 is coupled to the gate of the $24^{th}$ TFT T24. When the power supply of the crystal display panel is cut off, the last scan signal Glast is at high level, such that the $29^{th}$ TFT T29 is turned on, and the voltage level of the startup signal STV is dropped. Therefore, the working condition of the last stage of the GOA unit circuit is similar to the working conditions of the other stages of the GOA unit circuit, and thus the afterimage of the last column that may occur when the voltage level of the startup signal STV is too high can be avoided.

Figure 4:
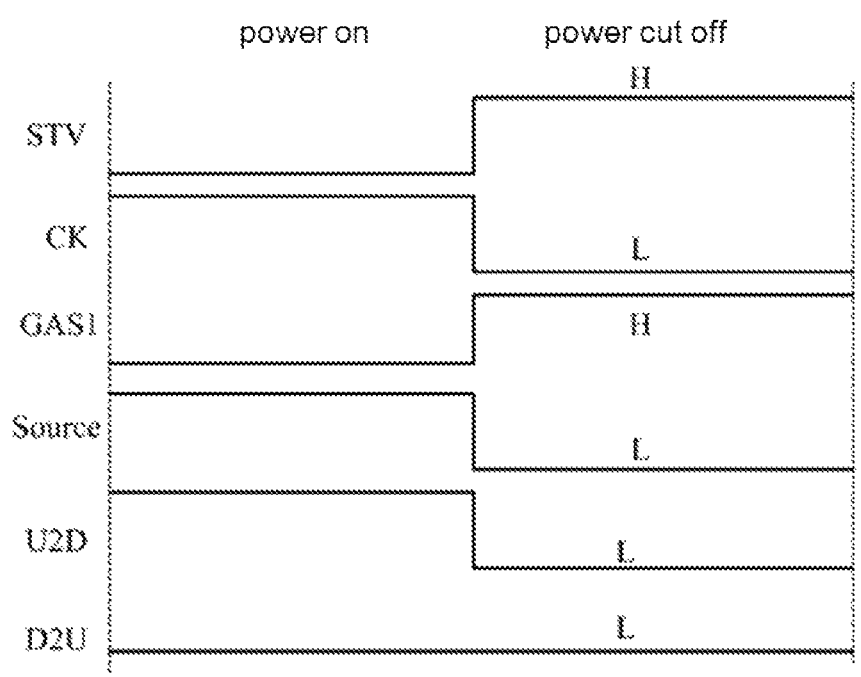
FIG. 4 is a waveform diagram of signals of a GOA circuit when a power supply is cut off according to one embodiment of the disclosure.

Referring to FIG. 4, a waveform diagram of signals of a GOA circuit when a power supply is cut off according to one embodiment of the disclosure is shown. As shown FIG. 4, when the power supply of the crystal display panel is cut off, the startup signal STV and the first global signal GAS1 are at high level, and the first scan control signal U2D, the second scan control signal D2U can all clock signals OK are at low level. For each stage of the GOA unit circuit, in the first global signal operation module 105, the $17^{th}$ TFT and the $18^{th}$ TFT are turned on because the first global signal GAS1 is at high level, such that the voltage level of the third signal port P(n) is dropped and the $16^{th}$ TFT and the $32^{th}$ TFT are turned off. The voltage level of the drain of the $17^{th}$ TFT is at high level because the $17^{th}$ TFT is turned on, and thus the $n^{th}$ scan signal Gn is on. Likewise, the $(n+1)^{th}$ scan signal Gn+1 is also on.

According to the above descriptions, the "All Gate ON" can be realized due to the first global signal GAS1. In addition, the afterimage of the first column can be avoided due to the $19^{th}$ TFT T19 in the first stage of the GOA unit circuit, and the afterimage of the last column can be avoided due to the $29^{th}$ TFT T29 in the last stage of the GOA unit circuit.

To sum up, in the present disclosure, the first global signal operation module and the second global signal operation module are configured in each stage of the GOA unit circuit, so "All Gate ON" can be realized when the power supply of the crystal display panel is cut off. Since all pixels of the crystal display panel can be turned on when the power supply of the crystal display panel is cut off, charges of the pixel electrodes can be discharged in time. The charges can be discharged through the data lines of the crystal display panel, so that the afterimages that may occur when the power supply of the crystal display panel is cut off can be avoided. The afterimages of the first column and the last column can be also avoided. As a result, the user experience can be improved.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A GOA circuit, used in a crystal display panel, comprising:

multiple stages of GOA unit circuits, each stage of GOA unit circuit including a first scan module, a first clock input module, a first signal port control module, a third signal port control module, a first output module, a first global signal operation module, a second scan module, a second clock input module, a second signal port control module, a fourth signal port control signal module, a second output module and a second global signal operation module;

wherein n is a positive integer, and except for the first stage of the GOA unit circuit and the last stage of the GOA unit circuit, in the $n^{th}$ stage of the GOA unit circuit:

the first scan module and the second scan module are configured to control the GOA circuit to do a forward scan or a backward scan according to a first scan control signal or a second scan control signal;

the first output module and the second output module are configured to both receive a first clock signal and sequentially output a $n^{th}$ scan signal and a $(n+2)^{th}$ scan signal according to the first clock signal;

the first clock input module is configured to output a second clock signal or a fourth clock signal to the third signal port control module, and the second clock input module is configured to output the fourth clock signal or the second clock signal to the fourth signal port control signal module;

the first signal port control module is configured to control the voltage level of a first signal port when the $n^{th}$ stage of the GOA unit circuit works, and the second signal port control module is configured to control the voltage level of a second signal port when the $n^{th}$ stage of the GOA unit circuit works;

the third signal port control module is configured to control the voltage level of a third signal port when the $n^{th}$ stage of the GOA unit circuit works, and the fourth signal port control signal module is configured to control the voltage level of a fourth signal port when the $n^{th}$ stage of the GOA unit circuit works; and the first global signal operation module and the second global signal operation module are configured to turn on all scan signals of the $n^{th}$ GOA unit circuit by using a first global signal when a power supply is cut off.

2. The GOA circuit according to claim 1, wherein the first scan module, the first clock input module, the first signal port control module and the first output module are electrically connected to the first signal port, the third signal port control module and the first global signal operation module are electrically connected to the third signal port, the second scan module, the second clock input module, the second signal port control module and the second output module are electrically connected to the second signal port, and the fourth signal port control signal module and the second global signal operation module are electrically connected to the fourth signal port.

3. The GOA circuit according to claim 2, wherein except for the first stage of the GOA unit circuit and the last stage of the GOA unit circuit, in the $n^{th}$ stage of the GOA unit circuit:

the first scan module includes a tenth TFT and a $14^{th}$ TFT, the gate of the tenth TFT is coupled to a $(n-2)^{th}$ scan signal outputted by the $(n-1)^{th}$ stage of the GOA unit circuit, the source of the tenth TFT is couple to the first scan control signal and the drain of the tenth TFT is couple to the first signal port, and the gate of the $14^{th}$ TFT is coupled to a $(n+2)^{th}$ scan signal outputted by the $n^{th}$ stage of the GOA unit circuit, the source of the $14^{th}$ TFT is couple to the second scan control signal and the drain of the $14^{th}$ TFT is couple to the first signal port; and the second scan module includes a $20^{th}$ TFT and a $24^{th}$ TFT, the gate of the $20^{th}$ TFT is coupled to a $n^{th}$ scan signal outputted by the $n^{th}$ stage of the GOA unit circuit, the source of the $20^{th}$ TFT is couple to the first scan control signal and the drain of the $20^{th}$ TFT is couple to the second signal port, and the gate of the $24^{th}$ TFT is coupled to a $(n+4)^{th}$ scan signal outputted by the $(n+1)^{th}$ stage of the GOA unit circuit, the source of the $24^{th}$ TFT is couple to the second scan control signal and the drain of the $24^{th}$ TFT is couple to the second signal port.

4. The GOA circuit according to claim 3, wherein in the first stage of the GOA unit circuit:

the gate of the tenth TFT is coupled to a startup signal;

the first stage of the GOA unit circuit includes a $19^{th}$ TFT, the gate of the $19^{th}$ TFT is coupled to a first scan signal outputted by the first stage of the GOA unit circuit, the source of the $19^{th}$ is coupled to a constant low voltage and the drain of the $19^{th}$ TFT is coupled to the gate of the tenth TFT.

5. The GOA circuit according to claim 3, wherein in the last stage of the GOA unit circuit;

the gate of the $24^{th}$ TFT is coupled to the startup signal;

the last stage of the GOA unit circuit includes a $29^{th}$ TFT, the gate of the $29^{th}$ TFT is coupled to a last scan signal outputted by the last stage of the GOA unit circuit, the source of the $29^{th}$ is coupled to a constant low voltage and the drain of the $29^{th}$ TFT is coupled to the gate of the $24^{th}$ TFT.

6. The GOA circuit according to claim 5, wherein the first output module includes a $30^{th}$ TFT, a $31^{th}$ TFT and a $32^{th}$ TFT, the source of the $30^{th}$ TFT is coupled to the first signal port, the gate of the $30^{th}$ TFT is coupled to a constant high voltage, the gate of the $31^{th}$ TFT is coupled to the drain of the $30^{th}$ TFT, the drain of the $31^{th}$ TFT is coupled to the first clock signal, the gate of the $32^{th}$ TFT is coupled to the third signal port, the source of the $32^{th}$ TFT is coupled to a constant low voltage, and the drain of the $32^{th}$ TFT is coupled to the source of the $31^{th}$ TFT and is electrically connected to the $n^{th}$ scan signal outputted by the $n^{th}$ stage of the GOA unit circuit;

wherein the second output module includes a $40^{th}$ TFT, a $41^{th}$ TFT and a $42^{th}$ TFT, the source of the $40^{th}$ TFT is coupled to the second signal port, the gate of the $40^{th}$ TFT is coupled to a constant high voltage, the gate of the $41^{th}$ TFT is coupled to the drain of the $40^{th}$ TFT, the drain of the $41^{th}$ TFT is coupled to the first clock signal, the gate of the $42^{th}$ TFT is coupled to the fourth signal port, the source of the $42^{th}$ TFT is coupled to a constant low voltage, and the drain of the $42^{th}$ TFT is coupled to the source of the $41^{th}$ TFT and is electrically connected to the $(n+2)^{th}$ scan signal outputted by the $n^{th}$ stage of the GOA unit circuit.

7. The GOA circuit according to claim 6, wherein the first clock input module includes a $11^{th}$ TFT and a $12^{th}$ TFT, the gate of the $11^{th}$ TFT is coupled to the first scan control signal, the drain of the $11^{th}$ TFT is coupled to the second clock signal, the gate of the $12^{th}$ TFT is coupled to the second scan control signal, the source of the $12^{th}$ TFT is coupled to the fourth clock signal, and the drain of the $12^{th}$ TFT is coupled to the source of the $11^{th}$ TFT;

wherein the second clock input module includes a $21^{th}$ TFT and a $22^{th}$ TFT, the gate of the $21^{th}$ TFT is coupled to the first scan control signal, the drain of the $21^{th}$ TFT is coupled to the fourth clock signal, the gate of the $22^{th}$ TFT is coupled to the second scan control signal, the source of the $22^{th}$ TFT is coupled to the second clock signal, and the drain of the $22^{th}$ TFT is coupled to the source of the $21^{th}$ TFT.

8. The GOA circuit according to claim 7, wherein the first signal port control module includes a $16^{th}$ TFT and a tenth capacitor, the gate of the $16^{th}$ TFT is coupled to the third signal port, the drain of the $16^{th}$ TFT is coupled to the first signal port, the source of the $16^{th}$ TFT is coupled to a constant low voltage, one end of the tenth capacitor is coupled to the constant low voltage and the other end of the tenth capacitor is coupled to the first signal port;

wherein the second signal port control module includes a $26^{th}$ TFT and a $20^{th}$ capacitor, the gate of the $26^{th}$ TFT is coupled to the fourth signal port, the drain of the $26^{th}$ TFT is coupled to the second signal port, the source of the $26^{th}$ TFT is coupled to a constant low voltage, one end of the $20^{th}$ capacitor is coupled to the constant low voltage and the other end of the 20$^{th}$ capacitor is coupled to the second signal port.

9. The GOA according to claim 8,
wherein the third signal port control module includes a 13$^{th}$ TFT, a 15$^{th}$ TFT and a 11$^{th}$ capacitor, the gate of the 13$^{th}$ TFT is coupled to the source of the 11$^{th}$ TFT, the drain of the 13$^{th}$ TFT is coupled to a constant high voltage, the source of the 13$^{th}$ TFT is coupled to the third signal port, the gate of the 15$^{th}$ TFT is coupled to the first signal port, the drain of the 15$^{th}$ TFT is coupled to a constant low voltage, the source of the 15$^{th}$ TFT is coupled to the third signal port, one end of the 11$^{th}$ capacitor is coupled to the constant low voltage, and the other end of the 11$^{th}$ capacitor is coupled to the third signal port;
wherein the fourth signal port control module includes a 23$^{th}$ TFT, a 25$^{th}$ TFT and a 21$^{th}$ capacitor, the gate of the 23$^{th}$ TFT is coupled to the source of the 21$^{th}$ TFT, the drain of the 23$^{th}$ TFT is coupled to a constant high voltage, the source of the 23$^{th}$ TFT is coupled to the fourth signal port, the gate of the 25$^{th}$ TFT is coupled to the second signal port, the drain of the 25$^{th}$ TFT is coupled to a constant low voltage, the source of the 25$^{th}$ TFT is coupled to the fourth signal port, one end of the 21$^{th}$ capacitor is coupled to the constant low voltage, and the other end of the 21$^{th}$ capacitor is coupled to the fourth signal port.

10. The GOA circuit according to claim 9,
wherein the first global signal operation module includes a 17$^{th}$ TFT and a 18$^{Th}$ TFT, the gate and the source of the 17$^{th}$ TFT are coupled, the drain of the 17$^{th}$ TFT is coupled to the n$^{th}$ scan signal outputted by the n$^{th}$ stage of the GOA unit circuit, the gate of the 18$^{th}$ TFT is coupled to the gate of the 17$^{th}$ TFT and is coupled to the first global signal, the drain of the 18$^{th}$ TFT is coupled to the third signal port, and the source of the 18$^{th}$ TFT is coupled to a constant low voltage;
wherein the second global signal operation module includes a 27$^{th}$ TFT and a 28$^{Th}$ TFT, the gate and the source of the 27$^{th}$ TFT are coupled, the drain of the 27$^{th}$ TFT is coupled to the (n+2)$^{th}$ scan signal outputted by the n$^{th}$ stage of the GOA unit circuit, the gate of the 28$^{th}$ TFT is coupled to the gate of the 27$^{th}$ TFT and is coupled to the first global signal, the drain of the 28$^{th}$ TFT is coupled to the fourth signal port, and the source of the 28$^{th}$ TFT is coupled to a constant low voltage.

11. The GOA circuit according to claim 10, wherein all TFTs are N-channel TFTs.

12. A GOA circuit, used in a crystal display panel, comprising:
multiple stages of GOA unit circuits, each stage of GOA unit circuit including a first scan module, a first clock input module, a first signal port control module, a third signal port control module, a first output module, a first global signal operation module, a second scan module, a second clock input module, a second signal port control module, a fourth signal port control signal module, a second output module and a second global signal operation module;
wherein n is a positive integer, and except for the first stage of the GOA unit circuit and the last stage of the GOA unit circuit, in the n$^{th}$ stage of the GOA unit circuit:
the first scan module and the second scan module are configured to control the GOA circuit to do a forward scan or a backward scan according to a first scan control signal or a second scan control signal;
the first output module and the second output module are configured to both receive a first clock signal and sequentially output a n$^{th}$ scan signal and a (n+2)$^{th}$ scan signal according to the first clock signal;
the first clock input module is configured to output a second clock signal or a fourth clock signal to the third signal port control module, and the second clock input module is configured to output the fourth clock signal or the second clock signal to the fourth signal port control signal;
the first signal port control module is configured to control the voltage level of a first signal port when the n$^{th}$ stage of the GOA unit circuit works, and the second signal port control module is configured to control the voltage level of a second signal port when the n$^{th}$ stage of the GOA unit circuit works;
the third signal port control module is configured to control the voltage level of a third signal port when the n$^{th}$ stage of the GOA unit circuit works, and the fourth signal port control signal is configured to control the voltage level of a fourth signal port when the n$^{th}$ stage of the GOA unit circuit works; and
the first global signal operation module and the second global signal operation module are configured to turn on all scan signals of the n$^{th}$ GOA unit circuit by using a first global signal when a power supply is cut off;
wherein the first global signal operation module includes a 17$^{th}$ TFT and a 18$^{Th}$ TFT, the gate and the source of the 17$^{th}$ TFT are coupled, the drain of the 17$^{th}$ TFT is coupled to the n$^{th}$ scan signal outputted by the n$^{th}$ stage of the GOA unit circuit, the gate of the 18$^{th}$ TFT is coupled to the gate of the 17$^{th}$ TFT and is coupled to the first global signal, the drain of the 18$^{th}$ TFT is coupled to the third signal port, and the source of the 18$^{th}$ TFT is coupled to a constant low voltage;
wherein the second global signal operation module includes a 27$^{th}$ TFT and a 28$^{Th}$ TFT, the gate and the source of the 27$^{th}$ TFT are coupled, the drain of the 27$^{th}$ TFT is coupled to the (n+2)$^{th}$ scan signal outputted by the n$^{th}$ stage of the GOA unit circuit, the gate of the 28$^{th}$ TFT is coupled to the gate of the 27$^{th}$ TFT and is coupled to the first global signal, the drain of the 28$^{th}$ TFT is coupled to the fourth signal port, and the source of the 28$^{th}$ TFT is coupled to a constant low voltage.

13. The GOA circuit according to claim 12, wherein the first scan module, the first clock input module, the first signal port control module and the first output module are electrically connected to the first signal port, the third signal port control module and the first global signal operation module are electrically connected to the third signal port, the second scan module, the second clock input module, the second signal port control module and the second output module are electrically connected to the second signal port, and the fourth signal port control signal module and the second global signal operation module are electrically connected to the fourth signal port.

14. The GOA circuit according to claim 12, wherein except for the first stage of the GOA unit circuit and the last stage of the GOA unit circuit, in the n$^{th}$ stage of the GOA unit circuit:
the first scan module includes a tenth TFT and a 14$^{th}$ TFT, the gate of the tenth TFT is coupled to a (n−2)$^{th}$ scan signal outputted by the (n−1)$^{th}$ stage of the GOA unit circuit, the source of the tenth TFT is couple to the first scan control signal and the drain of the tenth TFT is couple to the first signal port, and the gate of the 14$^{th}$ TFT is coupled to a (n+2)$^{th}$ scan signal outputted by the $n^{th}$ stage of the GOA unit circuit, the source of the $14^{th}$ TFT is couple to the second scan control signal and the drain of the $14^{th}$ TFT is couple to the first signal port; and the second scan module includes a $20^{th}$ TFT and a $24^{th}$ TFT, the gate of the $20^{th}$ TFT is coupled to a $n^{th}$ scan signal outputted by the $n^{th}$ stage of the GOA unit circuit, the source of the $20^{th}$ TFT is couple to the first scan control signal and the drain of the $20^{th}$ TFT is couple to the second signal port, and the gate of the $24^{th}$ TFT is coupled to a $(n+4)^{th}$ scan signal outputted by the $(n+1)^{th}$ stage of the GOA unit circuit, the source of the $24^{th}$ TFT is couple to the second scan control signal and the drain of the $24^{th}$ TFT is couple to the second signal port.

15. The GOA circuit according to claim 12, wherein in the first stage of the GOA unit circuit:
the gate of the tenth TFT is coupled to a startup signal;
the first stage of the GOA unit circuit includes a $19^{th}$ TFT, the gate of the $19^{th}$ TFT is coupled to a first scan signal outputted by the first stage of the GOA unit circuit, the source of the $19^{th}$ is coupled to a constant low voltage and the drain of the $19^{th}$ TFT is coupled to the gate of the tenth TFT.

16. The GOA circuit according to claim 12, wherein in the last stage of the GOA unit circuit;
the gate of the $24^{th}$ TFT is coupled to the startup signal;
the last stage of the GOA unit circuit includes a $29^{th}$ TFT, the gate of the $29^{th}$ TFT is coupled to a last scan signal outputted by the last stage of the GOA unit circuit, the source of the $29^{th}$ is coupled to a constant low voltage and the drain of the $29^{th}$ TFT is coupled to the gate of the $24^{th}$ TFT.

17. The GOA circuit according to claim 12,
wherein the first output module includes a $30^{th}$ TFT, a $31^{th}$ TFT and a $32^{th}$ TFT, the source of the $30^{th}$ TFT is coupled to the first signal port, the gate of the $30^{th}$ TFT is coupled to a constant high voltage, the gate of the $31^{th}$ TFT is coupled to the drain of the $30^{th}$ TFT, the drain of the $31^{th}$ TFT is coupled to the first clock signal, the gate of the $32^{th}$ TFT is coupled to the third signal port, the source of the $32^{th}$ TFT is coupled to a constant low voltage, and the drain of the $32^{th}$ TFT is coupled to the source of the $31^{th}$ TFT and is electrically connected to the $n^{th}$ scan signal outputted by the $n^{th}$ stage of the GOA unit circuit;
wherein the second output module includes a $40^{th}$ TFT, a $41^{th}$ TFT and a $42^{th}$ TFT, the source of the $40^{th}$ TFT is coupled to the second signal port, the gate of the $40^{th}$ TFT is coupled to a constant high voltage, the gate of the $41^{th}$ TFT is coupled to the drain of the $40^{th}$ TFT, the drain of the $41^{th}$ TFT is coupled to the first clock signal, the gate of the $42^{th}$ TFT is coupled to the fourth signal port, the source of the $42^{th}$ TFT is coupled to a constant low voltage, and the drain of the $42^{th}$ TFT is coupled to the source of the $41^{th}$ TFT and is electrically connected to the $(n+2)^{th}$ scan signal outputted by the $n^{th}$ stage of the GOA unit circuit.

18. The GOA circuit according to claim 12,
wherein the first clock input module includes a $11^{th}$ TFT and a $12^{th}$ TFT, the gate of the $11^{th}$ TFT is coupled to the first scan control signal, the drain of the $11^{th}$ TFT is coupled to the second clock signal, the gate of the $12^{th}$ TFT is coupled to the second scan control signal, the source of the $12^{th}$ TFT is coupled to the fourth clock signal, and the drain of the $12^{th}$ TFT is coupled to the source of the $11^{th}$ TFT;
wherein the second clock input module includes a $21^{th}$ TFT and a $22^{th}$ TFT, the gate of the $21^{th}$ TFT is coupled to the first scan control signal, the drain of the $21^{th}$ TFT is coupled to the fourth clock signal, the gate of the $22^{th}$ TFT is coupled to the second scan control signal, the source of the $22^{th}$ TFT is coupled to the second clock signal, and the drain of the $22^{th}$ TFT is coupled to the source of the $21^{th}$ TFT.

19. The GOA circuit according to claim 12,
wherein the first signal port control module includes a $16^{th}$ TFT and a tenth capacitor, the gate of the $16^{th}$ TFT is coupled to the third signal port, the drain of the $16^{th}$ TFT is coupled to the first signal port, the source of the $16^{th}$ TFT is coupled to a constant low voltage, one end of the tenth capacitor is coupled to the constant low voltage and the other end of the tenth capacitor is coupled to the first signal port;
wherein the second signal port control module includes a $26^{th}$ TFT and a $20^{th}$ capacitor, the gate of the $26^{th}$ TFT is coupled to the fourth signal port, the drain of the $26^{th}$ TFT is coupled to the second signal port, the source of the $26^{th}$ TFT is coupled to a constant low voltage, one end of the $20^{th}$ capacitor is coupled to the constant low voltage and the other end of the $20^{th}$ capacitor is coupled to the second signal port.

20. The GOA circuit according to claim 12,
wherein the third signal port control module includes a $13^{th}$ TFT, a $15^{th}$ TFT and a $11^{th}$ capacitor, the gate of the $13^{th}$ TFT is coupled to the source of the $11^{th}$ TFT, the drain of the $13^{th}$ TFT is coupled to a constant high voltage, the source of the $13^{th}$ TFT is coupled to the third signal port, the gate of the $15^{th}$ TFT is coupled to the first signal port, the drain of the $15^{th}$ TFT is coupled to a constant low voltage, the source of the $15^{th}$ TFT is coupled to the third signal port, one end of the $11^{th}$ capacitor is coupled to the constant low voltage, and the other end of the $11^{th}$ capacitor is coupled to the third signal port;
wherein the fourth signal port control module includes a $23^{th}$ TFT, a $25^{th}$ TFT and a $21^{th}$ capacitor, the gate of the $23^{th}$ TFT is coupled to the source of the $21^{th}$ TFT, the drain of the $23^{th}$ TFT is coupled to a constant high voltage, the source of the $23^{th}$ TFT is coupled to the fourth signal port, the gate of the $25^{th}$ TFT is coupled to the second signal port, the drain of the $25^{th}$ TFT is coupled to a constant low voltage, the source of the $25^{th}$ TFT is coupled to the fourth signal port, one end of the $21^{th}$ capacitor is coupled to the constant low voltage, and the other end of the $21^{th}$ capacitor is coupled to the fourth signal port.

* * * * *